United States Patent
Van De Pasch et al.

(10) Patent No.: US 6,853,440 B1
(45) Date of Patent: Feb. 8, 2005

(54) POSITION CORRECTION IN Y OF MASK OBJECT SHIFT DUE TO Z OFFSET AND NON-PERPENDICULAR ILLUMINATION

(75) Inventors: Engelbertus Antonius Fransiscus Van De Pasch, Oirschot (NL); Marcel Hendrikus Maria Beems, Veldhoven (NL); Hendricus J. M. Meijer, Veldhoven (NL); Daniel Galburt, Wilton, CT (US); Erik Roelof Loopstra, Heeze (NL)

(73) Assignee: ASML Netherlands B.V., Veldhoven (NL)

( * ) Notice: Subject to any disclaimer, the term of this patent is extended or adjusted under 35 U.S.C. 154(b) by 14 days.

(21) Appl. No.: 10/406,602

(22) Filed: Apr. 4, 2003

(51) Int. Cl.$^7$ .................. G03B 27/42; G03B 27/58; G03B 27/62; G03B 27/68
(52) U.S. Cl. .................. 355/53; 355/52; 355/72; 355/75
(58) Field of Search ................ 355/52, 53, 72, 355/75

(56) References Cited

U.S. PATENT DOCUMENTS

| | | | |
|---|---|---|---|
| 5,757,160 A | 5/1998 | Kreuzer | |
| 5,953,105 A | 9/1999 | Van Engelen et al. | |
| 5,956,192 A | 9/1999 | Williamson | |
| 6,262,792 B1 | 7/2001 | Higashiki | |
| 6,297,876 B1 | 10/2001 | Bornebroek | |
| 6,312,134 B1 * | 11/2001 | Jain et al. | 359/855 |
| 6,359,678 B1 | 3/2002 | Ota | |
| 6,369,874 B1 | 4/2002 | del Puerto | |
| 6,618,120 B2 * | 9/2003 | Ueta | 355/72 |

* cited by examiner

Primary Examiner—Rodney Fuller
(74) Attorney, Agent, or Firm—Pillsbury Winthrop LLP

(57) ABSTRACT

In a reflective lithographic projection apparatus, shifts in the image of a pattern of a mask in the scanning direction caused by variations in the position of the pattern surface of the mask along the optical axis are corrected by shifting of the relative position of the mask and/or the substrate in the scanning direction. Correction of the image rotation error may also be accomplished by rotation of the relative positions of the mask and/or the substrate about the optical axis. Variations in the position of the pattern surface of the mask along the optical axis may be determined by interferometers upon installation of the mask to the lithographic projection apparatus. The variations may be mapped and stored to provide control of the lithographic projection apparatus.

20 Claims, 5 Drawing Sheets

POSITION CORRECTION IN Y OF MASK OBJECT SHIFT DUE TO Z OFFSET AND NON-PERPENDICULAR ILLUMINATION

BACKGROUND OF THE INVENTION

1. Field of the Invention

The present invention relates to correction of a shift in the projected image of a pattern formed on a substrate of a lithographic projection apparatus caused by variations in the position of a pattern surface of a mask along the optical axis of the apparatus.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device. An example of such a patterning device is a mask. The concept of a mask is well known in lithography, and it includes mask types such as binary, alternating phase shift, and attenuated phase shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from United States Patents U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step and scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement and/or inspection of the imaged features. This array of procedures is used as a basis to pattern an individual layer of a device, e.g. an IC. Such a patterned layer may then undergo various processes such as etching, ion-implantation (doping), metallization, oxidation, chemical, mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-0672504.

In order to increase the degree of integration of semiconductor devices and keep pace with Moore's law, it will be necessary to provide lithographic projection apparatus capable of printing practical minimum line widths of 25–100 nm. Currently available photolithographic tools using 193 nm and 157 nm radiation can produce pattern features having a resolution (in nm) according to the well known equation R=$k_1$·λ/NA, where R is the resolution, $k_1$ is a constant that is dependent on the radiation sensitive material (resist) used, λ is the wavelength of the radiation, and NA is the numerical aperture. A lower limit; of $k_1$, is 0.25 and lithographic projection apparatus having a NA of 0.85 are currently available. Difficulties in optical design make increasing the NA difficult. As $k_1$ and NA A are generally considered to be at their limits, the ability to decrease the resolution, i.e, print smaller pattern features, of lithographic projection apparatus appears to be dependent on, decreasing the wavelength λ of the radiation.

Resolution enhancement techniques, such as phase shifting masks, optical proximity correction, sub-resolution assist features, and off-axis illumination, have allowed lithographic projection apparatus using 193 and 157 nm radiation to print pattern features of 100 nm resolution. In order to print pattern features smaller than 100 nm, there are currently being developed lithographic projection apparatus using radiation in the soft X-ray region having a wavelength of 5 to 15 nm, often-referred to as extreme ultraviolet (EUV).

The use of EUV radiation in a lithographic projection apparatus present several problems. EUV radiation is absorbed by all materials, including air. The EUV radiation source, illumination system, the projection system, the mask (reticle) and mask table, and the substrate (wafer) and the substrate table must be placed in a vacuum to prevent absorption of the EUV projection beam. Reflective masks are used in EUV lithographic projection apparatus as no materials exist for forming a mask which can efficiently transmit EUV radiation without absorption. It is also difficult to prepare a beam splitter for EUY radiation. It is therefore necessary that the EUV projection beam be radiated obliquely with respect to the mask to allow the reflected beam to reach the projection system without being blocked by illumination system optics.

Because the beam of radiation is radiated obliquely with respect to the mask, the patterned side of the mask is non-telecentric. The displacement of the mask along the optical (Z) axis results in a change in the magnification and a displacement of the exposed area in the scanning (Y) direction that results in a change of the position of the image on the wafer. There are several causes of variations of the mask pattern in the Z direction.

Mask unflatness is one cause of variations in the Z direction. Referring to FIG. 2, an unflat mask MA1 reflects a beam of radiation PB incident on the mass MA at an angle α (e.g. 50 mrad) at a point B. The beam PB is reflected by the mask MA1 onto a wafer W coated with a radiation sensitive material (photoresist) RSM. For the sake of simplicity, the projection system is omitted. Point B is displaced a distance $\Delta Y_w$=+/−tan α·ΔZ from a point A that would be imaged if the mask were truly flat the mask unflatness results in a shift in the mask pattern image on the wafer by an amount $\Delta Y_w$=+/−tan α·ΔZ/M, where M is the magnification of the projection system (not shown) and the sign of the amount $\Delta Y_w$ depends on the image reversal characteristic of the projection system. The shift $\Delta Y_w$ in the pattern image on the wafer results in an overlay (superimposing) error in the semiconductor manufacturing process. In a semiconductor device having a critical dimension of 100 nm, the maximum overlay error is not more than 30 nm. Other causes of overlay error besides variations in the Z direction include positioning/alignment accuracy between the mask and the wafer, the positioning accuracy of the wafer stage, including the stepping accuracy, and the distortion of the projection system, which may cause overlay errors of approximately 10 nm.

Another cause of variations in the Z direction in an EUV lithographic tool is the necessity of mounting of the mask on its back surface opposite the patterned surface. As the mask must be contained in a vacuum it must be clamped on its back surface, for example by an electrostatic chuck. In lithographic tools in which the use of a vacuum is not necessary, the patterned and mounting sides of the mask are the same. The mask focal plane is thus established at the plane of the mask stage platen. Accordingly, knowledge of the mask stage position in all six degrees of freedom results in knowledge of the mask patterned surface in all six degrees of freedom. Clamping of the mask on its back surface, as required in an EUV lithographic tool, causes the mask focal plane position relative to the mask stage position to be a function of mask flatness, mask thickness and mask thickness variation. In addition, framing blades are used as a field diaphragm at the mask focal plane and make determination of the mask focal plane difficult with current out of plane gauges.

Referring to FIG. 3, a mask MA2 displaced in the Z direction (as shown in dashed lines) by an amount ΔZ results in a shift of the image of point C to point D by an amount $\Delta Y_{MA}$=tan α·ΔZ. Unflatness of the mask MA2 and rotation of the mask MA2 about the X and Y axes also cause variations in the Z direction and shifting of the pattern image in the Y (scanning) direction. Displacement of the mask MA2 in the Z direction results in a shift in the mask pattern image on the wafer by an amount $\Delta Y_w$=+/−tan αΔZ/M, where M is the magnification of the projection system (not shown) and the sign of the amount $\Delta Y_w$ depends on the image reversal characteristic of the projection system.

For the sac of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of the design types for directing, shaping or controlling the beam of radiation, and such components may also be referred to below, collectively or singularly, as a "lens." Further, the lithographic apparatus may be of a type having two or more substrate tables (and/or two or more mask tables). In such "multiple sEage" devices the additional tables may be used in parallel or preparatory steps may be carried out on one or more tables while one or more other tables are being used for exposures. Dual stage lithographic apparatus are described, for example, in U.S. Pat. No. 5,969,441 and U.S. Pat. No. 6,262,796.

SUMMARY OF THE INTENTION

It is an aspect of the present invention to correct shifts of an image of a pattern on a mask in the scanning direction caused by variations of the pattern surface along the optical axis of a lithographic projection apparatus.

This and other aspects are achieved according to the invention in a lithographic apparatus including a radiation system constructed and arranged to supply a beam of radiation; a support structure constructed and arranged to support a patterning device, the patterning device constructed and arranged to pattern the beam of radiation according to a desired pattern; a substrate table to hold a substrate; and a projection system constructed and arranged to project the patterned beam onto a target portion of the substrate, the projection system including a mirror, wherein the support structure, the substrate table and the mirror are movable with respect to each other in a first direction and variations in a position of the pattern surface in a second direction perpendicular to the first direction are corrected by at least one of adjusting a position of the patterning device in the first direction, adjusting a position of the substrate in the first direction, adjusting a position of the mirror in the first direction, and rotating the substrate table about an axis parallel to the second direction.

According to another aspect of the present invention, there is provided a method of transferring a pattern formed on a reflective patterning device including a pattern surface onto a substrate coated with a radiation sensitive material by projecting a beam of radiation incident on the pattern device at a predetermined angle through a projection system while synchronously moving the patterning device, the substrate and the mirror in a first direction, the method including determining variations in a position of the pattern surface in a second direction perpendicular to the first direction; and adjusting at least one of a position of the patterning device in the first direction, adjusting a position of the substrate in the first direction, adjusting a position of the mirror in the first direction, and rotating the substrate about an axis parallel to the second direction to correct the variations in the position of the pattern from the focal plane.

According to a further aspect of the invention there is provided a device manufacturing method including providing a substrate that is at least partially covered by a layer of radiation-sensitive material; providing a beam of radiation using a radiation system; using a patterning device to endow the projection beam with a pattern in its cross-section; projecting the patterned beam of radiation onto a target portion of the layer of radiation-sensitive material; and at least one of adjusting a position of the pattering device in a first direction, adjusting a position of the substrate in the first direction adjusting a position of the mirror in the first direction, and rotating the substrate table about an axis parallel to a second direction perpendicular to the first direction.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. n will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which: a.

In the Figures, corresponding reference symbols indicate corresponding parts.

DETAILED DESCRIPTION

Figure 1:
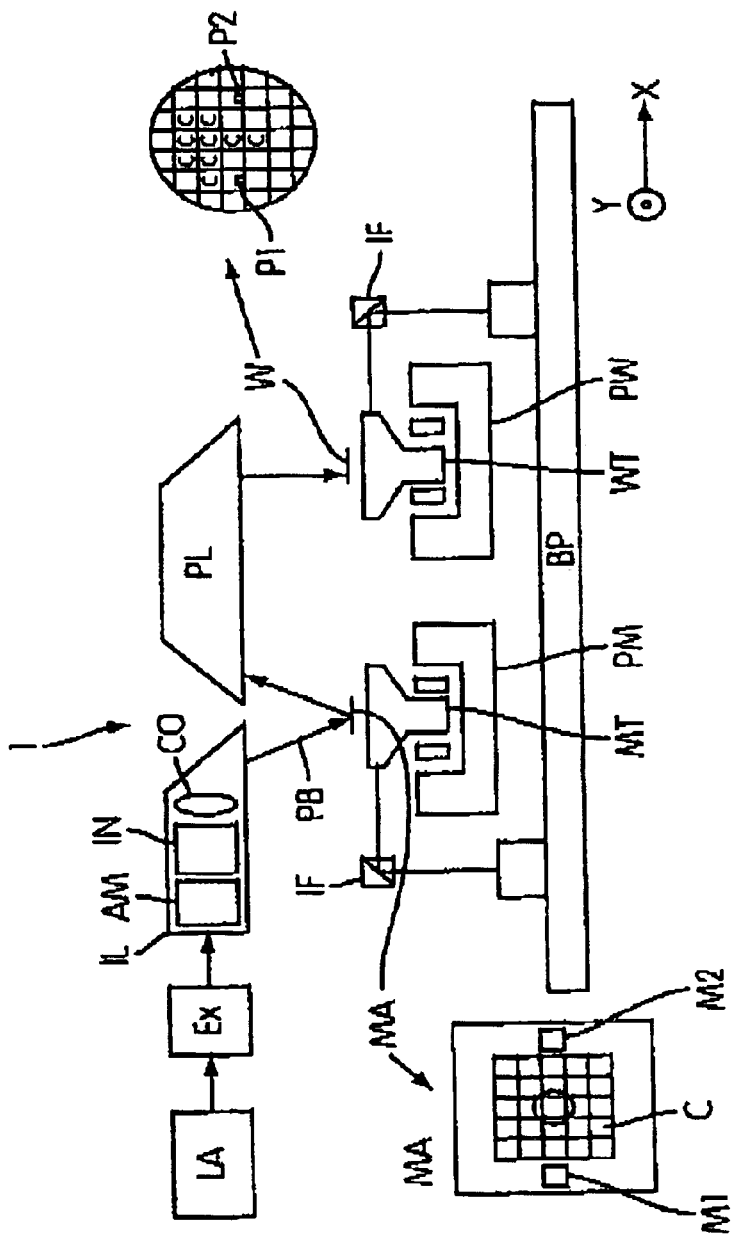
FIG. 1 is a schematic illustration of a lithographic projection apparatus.
Figure 2:
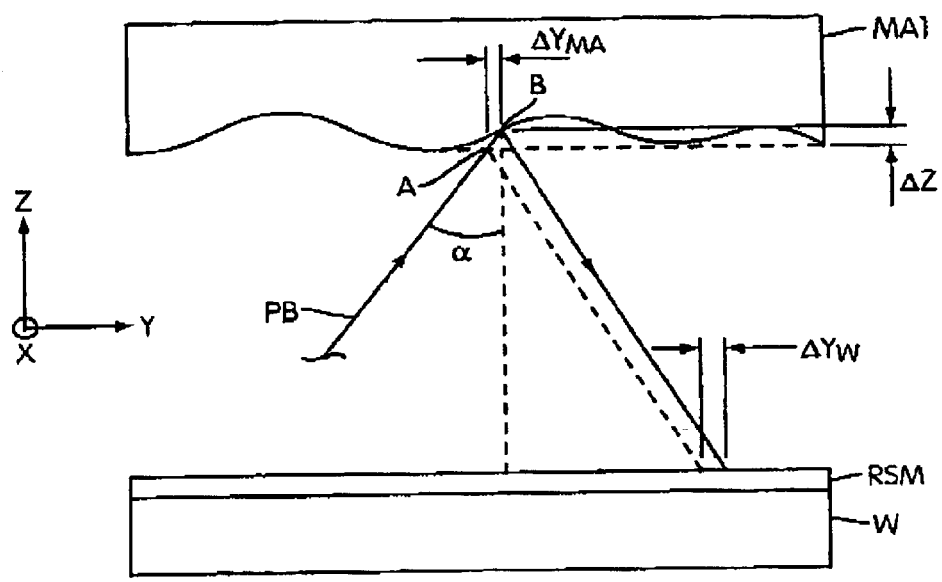
FIG. 2 is a schematic illustration of an image pattern shift due to mask unflatness.
Figure 3:
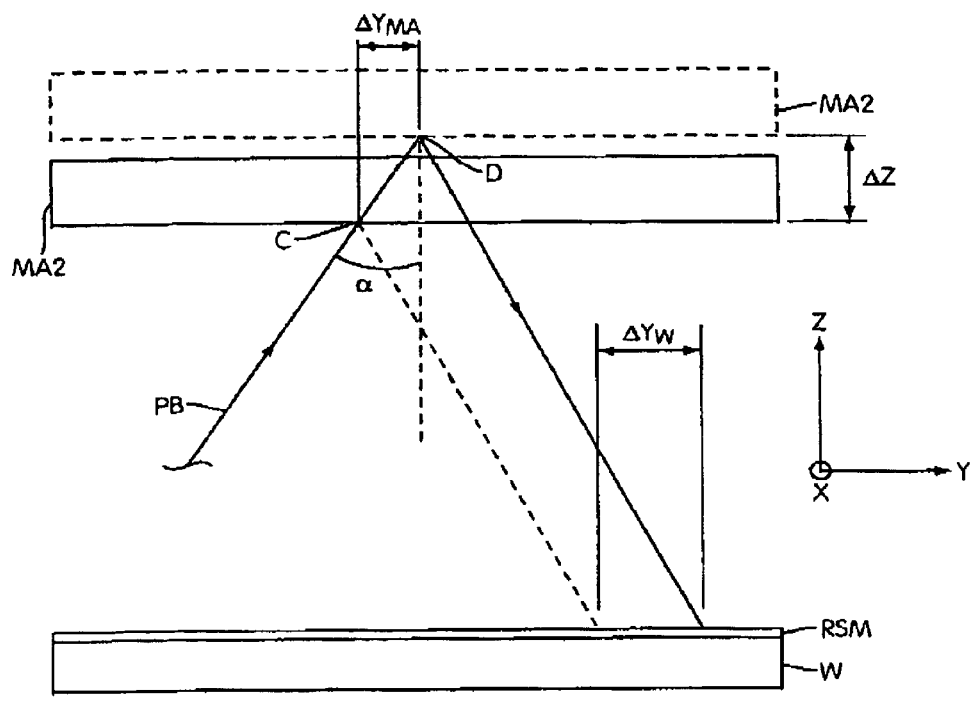
FIG. 3 is a schematic illustration of an image pattern shift due to displacement of the mask along the Z (optical) axis.

FIG. 1 schematically depicts a lithographic projection apparatus 1 according to an embodiment of the invention. The apparatus 1 includes a base plate BP; a radiation system Ex, IL constructed and arranged to supply a beam PB of radiation (e.g. EUV radiation), which in this particular case also comprises a radiation source LA; a first object (mask) Table MT provided with a mask holder constructed and arranged to hold a mask MA (e.g. a reticle), and connected to a first positioning device PM that accurately positions the mask with respect to a projection system or lens PL; a second object (substrate) table WT provided with a substrate holder constructed and arranged to hold a substrate W (e.g. a resist-coated silicon wafer), and connected to a second positioning device PW that accurately positions the substrate with respect to the projection system PL. The projection system or lens PL (e.g. a mirror group) is constructed and arranged to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces radiation. This radiation is fed into an illumination system (illuminator) IL, either directly or after having traversed a conditioning device, such as a beam expander Ex, for example. The illuminator IL may comprise an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash,"onto a target portion C. The substrate table WT is then shifted in the X and/or Y directions so that a different target portion C can be irradiated by the beam PB;
2. In scan mode, essentially the same scenario applies, except that a given target portion C is not exposed in a single "flash." Instead, the mask table MT is movable in a given direction (the so-called "scan direction", e.g., the Y direction) with a speed v, so that the beam PB is caused to scan over a mask image. Concurrently, the substrate table WT is simultaneously moved in the same or opposite direction at a speed $V=M_v$, in which M is the magnification of the lens PL (typically, M=¼ or ⅕). In this manner, a relatively large target portion C can be exposed, without having to compromise on resolution.

Figure 4:
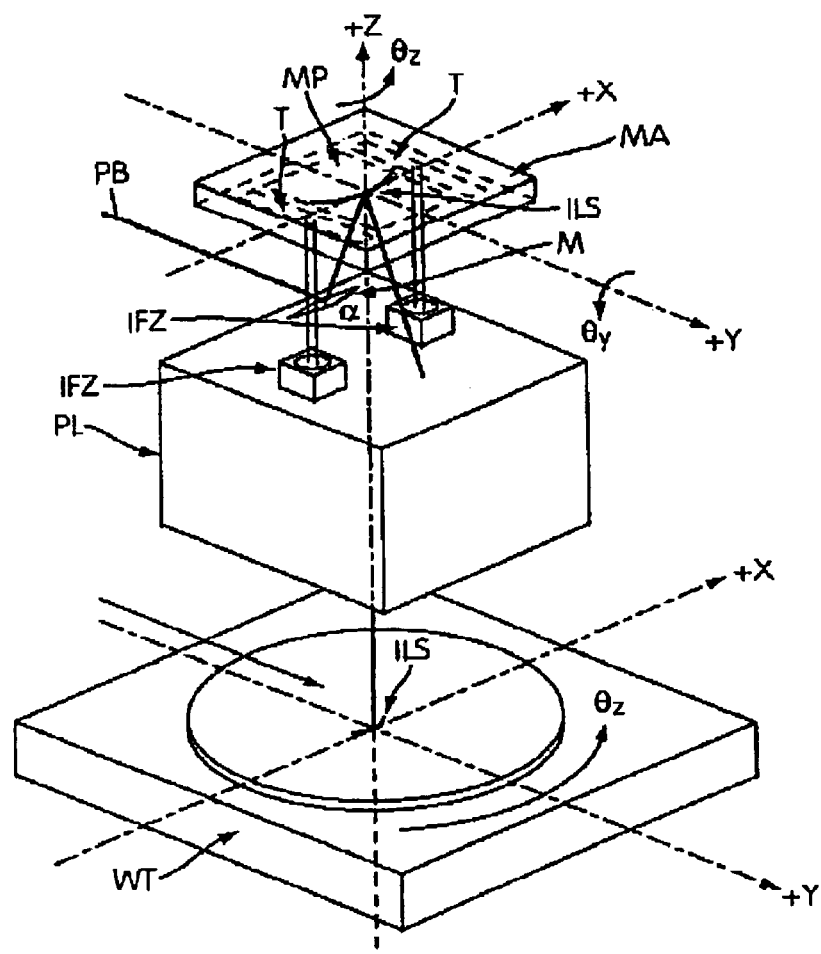
FIG. 4 is schematic illustration of a portion of the lithographic projection apparatus of FIG. 1.

Referring To FIG. 4, beam PB is reflected by a or M of the illumination system IL to be incident on the mask MA. A pair of interferometers IFZ are configured to measure the mask surface position with respect to the projection system PL. It will be appreciated that the interferometers my be mounted to the lithographic projection apparatus other than at the projection system, for example, on the base plate. The non-flatness or Z height position variation of the mask surface can be mapped using the pair of interferometers IFZ that measure the position of tracks T of the mask MA just outside mask pattern area MP while the mask MA scans the illuminated slit ILS. Although the pattern of the illuminated slit is shown as arcuate in FIG. 4, it will be appreciated by those of ordinary skill in the art that illuminated slits of other shapes may be used. The map can be stored in a memory of a controller that controls operation of the lithographic projection apparatus 1. The position of the mask may be determined in all six degrees of freedom, for example through the use of additional interferometers that determine the mask's position in the remaining degrees of freedom, and the mask focal plane can be determined from the map.

The mapped mask position error $\Delta Z$ is defined as $\Delta Z=(\Delta Z1+\Delta Z2)/2$, wherein $\Delta Z1$ and $\Delta Z2$ are errors measured by the interferometers IFZ in the tracks T. The pattern shift at the mask is defined as $\Delta Y_{MA}=\tan\alpha\cdot\Delta Z$ and the pattern shift on the wafer is defined as $\Delta Y_w=+/-\tan\alpha\cdot\Delta Z/M$, where M is the magnification of the projection system PL and the sign of the amount $\Delta Y_w$ depends on the image reversal characteristic of the projection system PL. The pattern shift $\Delta Y$ maybe corrected by moving the mask table MT an amount equal to $\Delta Y_{MA}$, the wafer table WT an amount $\Delta Y_w$, or each of the mask table MT and the wafer table WT an amount that corrects the pattern shift.

Because oblique mask illumination is used, rotation of the mask pattern surface in the XZ plane will result in a rotation error of the projected image of the mask pattern on the wafer W in the XY (wafer) plane. The rotation error of the projected image at the wafer plane is defined by $\Delta\theta zw=+/-\tan\alpha\cdot\Delta\theta y$, wherein $\Delta\theta y$ is the mapped mask rotational error and is defined as $\Delta\theta y=(\Delta Z2-\Delta Z1)/d$, wherein d is the spacing between the interferometers IFZ in the X axis direction. The magnification of the projection system PL does not affect the amount of image rotation error $\Delta\theta zw$ and the sign of the image rotation error $\Delta\theta zw$ depends on the image reversal characteristics of the projection system PL.

The mapped mask position error $\Delta Z$ and the mapped mask rotational error $\Delta\theta y$ may be directly corrected by displacing the mask table MT by amount $-\Delta Z$ in the Z axis; direction and rotating the mask table MT by an angle $-\Delta\theta y$. Direct corrections of the errors requires correction of the position of the mask table MT. It is possible, however, to correct only the pattern shift $\Delta Y$ and the image rotation error $\Delta\theta zw$ by correcting the position of either the mask table MT, the wafer table WT, or a combination of both, by shifting and/or rotating the mask table MT, the wafer table WT, or both tables, in the direction opposite the pattern shift $\Delta Y$ and the image rotation error $\Delta\theta zw$. This approach ignores the effects that the mapped position error $\Delta Z$ and the mapped mask rotational error $\Delta\theta y$ will have on the focus of the image at the wafer, but as EUV lithography tools have relatively low NA and high depth of focus, the focus is within acceptable limits. In addition, if the position of mask table MT is moved in the Y axis direction to correct for the pattern shift $\Delta Y$ the size of the correction is not reduced by the projection system magnification. Also, correction of the pattern shift $\Delta Y$ and the image rotation error $\Delta\theta zw$ by positioning of the mask table MT is not dependent on the image reversal characteristics of the projection system PL. It will be appreciated that it is possible to correct only for the pattern shift $\Delta Y$ or to correct only for the image rotation error $\Delta\theta zw$ in addition to correcting both.

Figure 5:
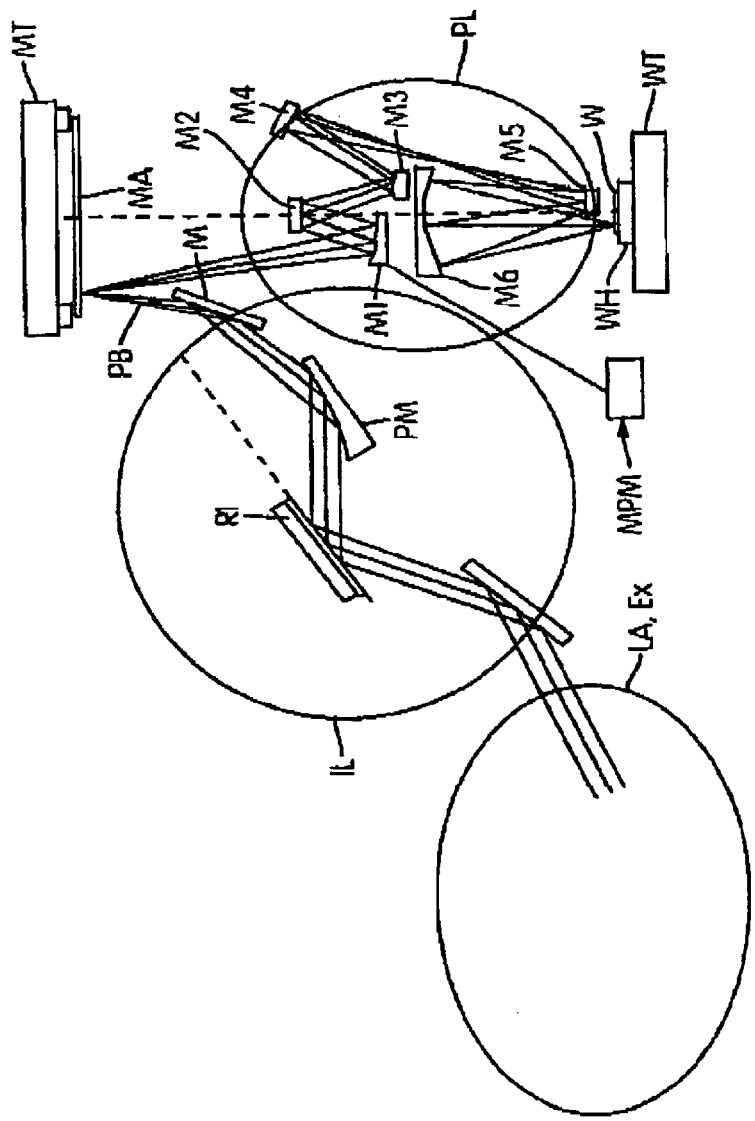
FIG. 5 is a schematic illustration of the lithographic projection apparatus, including details of the projection system.

Referring to FIG. 5, the illumination system EL of the lithographic projection apparatus 1 includes a reflective integrator RI and a parabolic mirror PM. The projection system PL includes mirrors M1–M6. Although at least six mirrors are necessary for an EUV projection system, it should be appreciated that projection systems including more than six mirrors may be used. The pattern shift $\Delta Y$ in the scanning direction may be corrected by moving the first mirror M1 of the projection system PL during scanning in at least one of six degrees of freedom. The first mirror M1 is moved by a mirror positioning mechanism MPM during scanning of the mask MA and wafer W. Adjustment of the position of the mirror M1 during scanning may include movement or rotation of the mirror during scanning. It should be appreciated that the mirror M1 may be moved or rotated relative to the mask MA and the wafer W, as it is the relative position of the mirror M1, the mask MA and the wafer W that determines the position of the image of the pattern formed on the radiation sensitive material on the wafer W, and that adjustment of the mask MA and the wafer W with respect to the mirror may include adjusting the velocity of the mask MA and the wafer W during scanning. Any combination of adjustment of the positions of the mirror M1, the mask MA and the wafer W that results in correction of the pattern shift ΔY and or the image rotation error Δθzw may be used.

It should be appreciated that the techniques disclosed above to correct the pattern shift in the scanning (Y) direction caused by variations of the mask along the optical (Z) axis may be used alone or in combination.

While specific embodiments of the invention have been described above, it will be appreciated that the invention may be practiced otherwise than as described. The description is not intended to limit the invention.

What is claimed is:

1. A lithographic projection apparatus, comprising:
    a radiation system constructed and arranged to provide a bean of radiation;
    a support structure constructed and arranged to support a reflective patterning device, the patterning device including a pattern surface and constructed and arranged to pattern the beam of radiation according to a desired pattern;
    a substrate table to hold a substrate; and
    a projection system constructed and arranged to project the patterned beam onto a target portion of the substrate, wherein the support structure and the substrate table are movable with respect to each other in a first direction and during movement of the support structure and the substrate table with respect to each other a variation in a position of the pattern surface in a second direction perpendicular to the first direction is corrected by at least one of adjusting a position of the patterning device in the first direction, adjusting a position of the substrate in the first direction, rotating the substrate about an axis parallel to the second direction, and rotating the patterning device about the axis parallel to the second direction.

2. An apparatus according to claim 1, further comprising an interferometer system constructed and arranged to determine the variation of the position of the pattern surface in the second direction.

3. An apparatus according to claim 2, wherein the interferometer system includes two interferometers that determine the position of the pattern surface with respect to the projection system.

4. An apparatus according to claim 2, wherein the interferometer system determines the variation of the position of the pattern surface in the second direction by measuring the position of tracks of the patterning device outside the pattern surface.

5. An apparatus according to claim 1, wherein the positions of the patterning device and the substrate are adjusted relative to each other during movement of the support structure and the substrate table with respect to each other in the first direction by an amount $\Delta Y = \Delta Z \cdot \tan \alpha$, where $\Delta Z$ is the variation of the position of the pattern surface in the second direction and $\alpha$ is an angle of incidence of the projection beam on the patterning device.

6. An apparatus according to claim 5, wherein adjusting the positions of the patterning device and the substrate relative to each other includes adjusting a velocity of the patterning device and the substrate with respect to each other during movement of the patterning device and the substrate relative to each other.

7. An apparatus according to claim 1, wherein rotating the substrate about the axis parallel to the second direction includes rotating the substrate by an amount $\Delta\theta_{2w} = +/- \tan \alpha \cdot (\Delta Z2 - \Delta Z1)/d$, wherein $\alpha$ is the angle of incidence of the projection beam on the patterning device, $\Delta Z1$ is a first measured variation in a position of the pattern surface in the second direction, $\Delta Z2$ is a second measured variation in a position of the pattern surface in the second direction, and d is a distance between two measurement positions of $\Delta Z1$ and $\Delta Z2$ in a third direction perpendicular to the first and second directions.

8. An apparatus according to claim 1, wherein a velocity of the support structure and a velocity of the substrate table are adjustable with respect to each other during movement of the support structure and the substrate table with respect to each other.

9. A met of transferring a pattern formed on a reflective patterning device including a pattern surface onto a substrate coated with a radiation sensitive material, comprising:
    projecting a beam of radiation incident on the patterning device at a predetermined angle through a projection system while synchronously moving the patterning device, the substrate and a mirror of the projection system in a first direction;
    determining variations in a position of the pattern surface in a second direction perpendicular to the first direction; and
    during synchronous movement the patterning device, the substrate and the mirror, adjusting at least one of a position of the patterning device in the first direction, adjusting a position of the substrate in the first direction, adjusting a position of the mirror in the first direction, and rotating the substrate about an axis parallel to the second direction to connect the variations in the position of the pattern from a focal plane.

10. A method according to claim 9, wherein determining the variations in the position of the pattern surface includes determining a position of the patterning device with respect to the projection system.

11. A method according to claim 9, wherein adjusting the positions of the patterning device, the substrate and the mirror relative to each other in the first direction includes adjusting the relative positions by an amount $\Delta Y = \Delta Z \cdot \tan \alpha$, where $\Delta Z$ is an amount of the variation of the pattern from the focal plane and $\alpha$ is the angle of incidence of the beam of radiation on the pattering device.

12. A method according to claim 11, wherein adjusting the positions of the patterning device, the substrate and the mirror relative to each other includes adjusting a velocity of at least one of the patterning device, the wafer and the mirror with respect to each other during movement of the patterning device, the substrate, and the mirror relative to each other.

13. A method according to claim 9, wherein rotating the substrate about the axis includes rotating the substrate by an amount $\Delta\theta z = +/- \tan \alpha \cdot (\Delta Z2 - \Delta Z1)/d$, wherein $\alpha$ is the angle of incidence of the projection beam on the patterning device, $\Delta Z1$ is a first measured variation of the pattern surface in the second direction, $\Delta Z2$ is a second measured variation of the pattern surface in the second direction, and d is a distance between two displacement measuring devices in a third direction perpendicular to the first and second directions.

14. A method according to claim 9, wherein determining variations in the position of the pattern surface in the second direction includes determining variations of a position of the pattern surface in the second direction by measuring the position of tracks of the patterning device outside the pattern surface.

15. A method according to claim 9, further comprising adjusting a velocity of the patterning device, a velocity of the substrate, and a velocity of the mirror with respect to each other during synchronous movement of the patterning device, the substrate, and the mirror.

16. A device manufacturing method, comprising:
providing a substrate that is at least partially covered by a layer of radiation sensitive material;
providing a beam of radiation using a radiation system;
using a pattering device to endow the projection beam with a pattern in its cross-section;
projecting the patterned beam of radiation onto a target portion of the layer of radiation sensitive material using a projection system including a mirror;
synchronously moving the substrate, the patterning device and the mirror with respect to each other in a first direction; and
at least one of adjusting a position of the patterning device in the first direction, adjusting a position of the substrate in the first direction, adjusting a position of the mirror in the first direction, and rotating the substrate table about an axis parallel to a second direction perpendicular to the first direction during synchronous movement of the substrate, the patterning device and the mirror with respect to each other.

17. A method according to claim 16, further comprising adjusting a velocity of the patterning device, a velocity of the substrate, and a velocity of the mirror with respect to each other during synchronous movement of the patterning device the substrate and the mirror with respect to each other.

18. A lithographic projection apparatus, comprising:
a radiation system constructed and arranged to provide a projection beam of radiation;
a support structure constructed and arranged to support a reflective patterning device, the patterning device including a pattern surface and constructed and arranged to pattern the projection beam according to a desired pattern;
a substrate table to hold a substrate; and
a projection system constructed and arranged to project the patterned beam onto a target portion of the substrate, the projection system including a mirror, wherein the support structure the substrate table and the mirror are each movable with respect to each other in a first direction and variations in a position of the pattern surface in a second direction perpendicular to the first direction are corrected by at least one of adjusting a position of the patterning device in the first direction, adjusting a position of the substrate in the first direction, adjusting a position of the mirror in at least one of six degrees of freedom, rotating the substrate about an axis parallel to the second direction, and rotating the patterning device about the axis parallel to the second direction.

19. A apparatus according to claim 18, wherein the variations in the pattern surface in the second direction are determined by measuring variations of positions of tracks of the patterning device outside the pattern surface.

20. An apparatus according to claim 18, wherein a velocity of the support structure, a velocity of the substrate table, and a velocity of the mirror adjustable with respect to each other during movement of the support structure, the substrate table, and mirror with respect to each other.

* * * * *